united States Patent
Xu et al.

(10) Patent No.: US 10,693,274 B2
(45) Date of Patent: Jun. 23, 2020

(54) MULTI-WAVELENGTH NARROW-LINEWIDTH SINGLE-FREQUENCY OPTICAL FIBER LASER SOURCE FOR LASER RADAR SYSTEM

(71) Applicant: SOUTH CHINA UNIVERSITY OF TECHNOLOGY, Guangdong (CN)

(72) Inventors: Shanhui Xu, Guangdong (CN); Zhongmin Yang, Guangdong (CN); Yuning Zhang, Guangdong (CN); Zhouming Feng, Guangdong (CN); Changsheng Yang, Guangdong (CN)

(73) Assignee: SOUTH CHINA UNIVERSITY OF TECHNOLOGY, Guangdong (CN)

( * ) Notice: Subject to any disclaimer, the term of this patent is extended or adjusted under 35 U.S.C. 154(b) by 0 days.

(21) Appl. No.: 16/343,412

(22) PCT Filed: Dec. 19, 2016

(86) PCT No.: PCT/CN2016/110654
§ 371 (c)(1),
(2) Date: Apr. 19, 2019

(87) PCT Pub. No.: WO2018/072295
PCT Pub. Date: Apr. 26, 2018

(65) Prior Publication Data
US 2019/0252845 A1 Aug. 15, 2019

(30) Foreign Application Priority Data
Oct. 21, 2016 (CN) .......................... 2016 1 0917884

(51) Int. Cl.
*H01S 3/30* (2006.01)
*H01S 3/08* (2006.01)
(Continued)

(52) U.S. Cl.
CPC ........ *H01S 3/08086* (2013.01); *H01S 3/0675* (2013.01); *H01S 3/08013* (2013.01);
(Continued)

(58) Field of Classification Search
CPC .............. H01S 3/08086; H01S 3/0675; H01S 3/08013; H01S 3/094015; H01S 3/0941;
(Continued)

(56) References Cited

U.S. PATENT DOCUMENTS 6,515,789 B1 * 2/2003 Morgan .................... G02F 1/09
359/280
8,867,584 B2 * 10/2014 Dunn .................... H01S 3/0823
372/92
(Continued)

FOREIGN PATENT DOCUMENTS

CN 101013792 8/2007
CN 101572375 11/2009
(Continued)

OTHER PUBLICATIONS

"International Search Report (Form PCT/ISA/210)" dated Jul. 10, 2017, with English translation thereof, pp. 1-6.

*Primary Examiner* — Kinam Park
(74) *Attorney, Agent, or Firm* — JCIPRNET

(57) ABSTRACT

A multi-wavelength single-frequency optical fiber laser source for a laser radar system includes a resonant cavity composed of a high-reflectivity chirped optical fiber grating, a high gain optical fiber and a low-reflectivity chirped optical fiber grating, a single-mode semiconductor pump laser served as a pump light source, an optical wavelength division multiplexer, an optical coupler, an optical isolator, an optical circulator, an optical filter module, and a semiconductor optical amplifier. The pump light source performs optical fiber core pumping with respect to the high gain (Continued)

optical fiber. A portion of the wide-spectrum laser is filtered by the optical filter module to obtain a wavelength corresponding to a specific central frequency. Multi-wavelength laser lasing with a narrow linewidth and single longitudinal mode is implemented by combining a short linear resonant cavity structure and the optical filter module.

7 Claims, 1 Drawing Sheet

(51) Int. Cl.
*H01S 3/067* (2006.01)
*H01S 3/094* (2006.01)
*H01S 3/0941* (2006.01)
*H01S 3/13* (2006.01)
*H01S 5/50* (2006.01)
*H01S 3/00* (2006.01)

(52) U.S. Cl.
CPC ........ *H01S 3/08045* (2013.01); *H01S 3/0941* (2013.01); *H01S 3/094015* (2013.01); *H01S 3/1301* (2013.01); *H01S 3/0064* (2013.01); *H01S 3/06716* (2013.01); *H01S 3/08027* (2013.01); *H01S 3/09415* (2013.01); *H01S 3/094053* (2013.01); *H01S 3/094084* (2013.01); *H01S 5/50* (2013.01)

(58) Field of Classification Search
CPC ............... H01S 3/0064; H01S 3/08027; H01S 3/09415; H01S 3/08045; H01S 3/1301; H01S 3/094053; H01S 3/06716; H01S 3/094084

See application file for complete search history.

(56) References Cited

U.S. PATENT DOCUMENTS

| | | | |
|---|---|---|---|
| 2002/0063935 A1* | 5/2002 | Price | H04B 10/505 398/182 |
| 2003/0025971 A1* | 2/2003 | Price | H04B 10/2575 398/183 |
| 2005/0053101 A1 | 3/2005 | Liu | |
| 2008/0317071 A1 | 12/2008 | Guan et al. | |
| 2013/0003766 A1* | 1/2013 | Savchenkov | G02F 2/02 372/38.01 |
| 2015/0311669 A1* | 10/2015 | Chuang | H01S 5/0064 398/65 |
| 2016/0315440 A1* | 10/2016 | Han | H01S 3/06791 |
| 2018/0097332 A1* | 4/2018 | Xu | H01S 3/10023 |

FOREIGN PATENT DOCUMENTS

| | | |
|---|---|---|
| CN | 103972772 | 8/2014 |
| CN | 104218437 | 12/2014 |
| CN | 105428973 | 3/2016 |
| CN | 105932530 | 9/2016 |

* cited by examiner

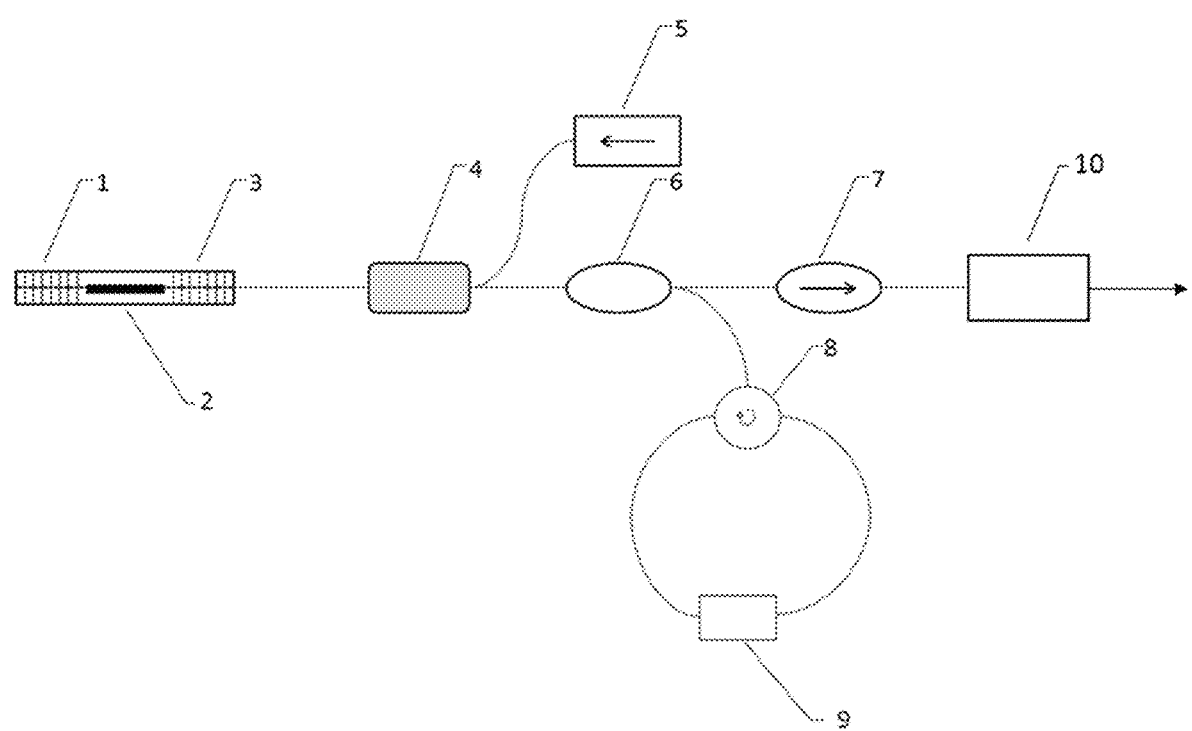

MULTI-WAVELENGTH NARROW-LINEWIDTH SINGLE-FREQUENCY OPTICAL FIBER LASER SOURCE FOR LASER RADAR SYSTEM

CROSS-REFERENCE TO RELATED APPLICATION

This is a 371 application of the International PCT application serial no. PCT/CN2016/110654, filed on Dec. 19, 2016, which claims the priority benefits of China Application No. CN201610917884.6, filed on Oct. 21, 2016. The entirety of each of the above-mentioned patent applications is hereby incorporated by reference herein and made a part of this specification.

TECHNICAL FIELD

The present invention relates to the fields of laser radar, optical fiber sensing, coherent spectrum beam combining, particularly to an optical fiber laser technology which can be applied to a laser radar system, and more particularly, to a single-frequency optical fiber laser source outputting multi-wavelengths and narrow-linewidths.

BACKGROUND

A laser radar system includes a single-beam narrow-band laser and a receiving system. The laser generates and emits a beam of light pulse, which hits an object and is reflected back, and is finally received by a receiver. The receiver accurately measures a transmission time of the light pulse from being emitted to being reflected. Since the light pulse is transmitted at a velocity of light, the receiver always receives the previously reflected pulse before next pulse is emitted. In view that the velocity of light is known, the transmission time can be converted into a measurement on distance. With reference to a height of the laser, a laser scanning angle, a position of the laser obtained from a GPS, and a laser emission direction obtained from an inertial navigation system (INS), coordinates X, Y and Z of each ground spot can be accurately calculated. An emission frequency of a laser beam may range from several pulses per second to tens of thousands of pulses per second. For example, for a system with a frequency of 10,000 pulses per second, the receiver may record 600,000 points in one minute. In general, the ground spot spacing of the laser radar system varies from 2 m to 4 m.

The current laser radar system mainly uses a single-beam narrow-band laser as an emitter, which has a small detection range and a low speed. A multi-beam narrow-band laser can expand the detection range of the laser radar, and greatly shorten the scanning speed.

SUMMARY

The present invention is intended to overcome the deficiencies above in the prior art, and discloses a multi-wavelength narrow-linewidth single-frequency optical fiber laser source for a laser radar system, which implements a multi-wavelength single-frequency optical fiber laser source with an all-optical fiber structure via a self-injection locking structure combined with a short linear resonant cavity and an optical filter module.

The object of the present invention is achieved at least by one of the following technical solutions.

A multi-wavelength narrow-linewidth single-frequency optical fiber laser source for a laser radar system includes a high-reflectivity chirped optical fiber grating, a high gain optical fiber, a low-reflectivity chirped optical fiber grating, an optical wavelength division multiplexer, a single-mode semiconductor pump laser, an optical coupler, an optical isolator, an optical circulator, an optical filter module and a semiconductor optical amplifier. A structure relationship between each component is that the high gain optical fiber is used as a gain medium of a laser resonant cavity with a compact structure, and the low-reflectivity chirped optical fiber grating and the high-reflectivity chirped optical fiber grating form front and back cavity mirrors of the laser resonant cavity to realize laser oscillation in the cavity. The high-reflectivity chirped optical fiber grating, the high gain optical fiber and the low-reflectivity chirped optical fiber grating form the resonant cavity of the laser. A portion of the laser enters the optical filter module via the optical circulator after the laser outputted by the resonant cavity passes through the optical coupler. After selecting a plurality of wavelengths corresponding to central frequencies via the optical filter module with a certain free spectrum width, the laser is injected back into the laser resonant cavity via the optical circulator and the optical coupler, combined with a short linear resonant cavity structure, the resonant cavity after self-injection locking lases a single-frequency optical fiber laser with a plurality of wavelengths corresponding to the central frequencies. A single-frequency laser signal enters the optical coupler via a signal end of the optical wavelength division multiplexer, and then is outputted from an output end of the optical isolator. The outputted laser signal is subjected to noise suppression and optical performance optimization via the semiconductor optical amplifier.

As a further optimization, the optical filter module is a device that may select to pass through or block a specific wavelength in an optical path system through a certain free spectral range and a certain bandwidth, and the output wavelength includes but is not limited to two or several specific optical output wavelengths.

As a further optimization, the optical filter module is not limited to an F-P filter, an optical fiber grating filter, and other types of filters.

As a further optimization, the optical fiber laser is a compact short linear cavity structure, the front cavity mirror of the optical fiber laser is the low-reflectivity chirped optical fiber grating, and the high-reflectivity chirped optical fiber grating is used as the back cavity mirror. The low-reflectivity chirped optical fiber grating has low reflection to an exciting light signal, with a reflectivity of 10% to 90%, and a 3 dB reflection spectrum width of 1 nm to 40 nm. The high-reflectivity chirped optical fiber grating is highly transparent to a pump light, with a transmissivity greater than 90%, and is highly reflective to the exciting light signal, with a reflectivity greater than 95%, and a 3 dB reflection spectrum width of 1 nm to 40 nm.

As a further optimization, a gain per unit length of the high gain optical fiber is greater than 0.2 dB/cm, and a length of the optical fiber is 0.5 cm to 100 cm.

Compared with the prior art, the present invention has the following advantages and technical effects: according to the present invention, the high gain optical fiber of a centimeter magnitude may be used as the gain medium of the laser, the low-reflectivity chirped optical fiber grating and the high-reflectivity chirped optical fiber grating form the front and back cavity mirrors of the resonant cavity structure. Under continuous excitation of a single-mode semiconductor laser pump source, high gain particles in the optical fiber core are inverted to generate laser signals by stimulated emission. After a broadband laser signal outputted by the resonant cavity passes through the optical coupler, a portion of the laser enters the optical filter module via the optical circulator, and single longitudinal-mode laser signals with several wavelengths corresponding to the central frequencies are obtained after longitudinal mode selection of the optical filter module, and then injected back into the resonant cavity via the optical circulator and the optical coupler; and then the short linear cavity after self-injection locking can lase the single-frequency laser with a plurality of wavelengths corresponding to the central frequencies.

BRIEF DESCRIPTION OF THE DRAWINGS

FIG. 1 is a schematic diagram of a multi-wavelength narrow-linewidth single-frequency optical fiber laser source for a laser radar system according to an embodiment.

DETAILED DESCRIPTION

The detailed embodiments of the present invention are further described with reference to the drawings and the specific examples. It should be noted that the scope of protection of the present invention is not limited to the scope expressed by the embodiments, and all the following procedures or parameters not specifically described can be realized by hose skilled in the art with reference c the prior art.

As shown in FIG. 1, a multi-wavelength narrow-linewidth single-frequency optical fiber laser source for a laser radar system includes a high-reflectivity chirped optical fiber grating 1, a high gain optical fiber 2, a low-reflectivity chirped optical fiber grating 3, an optical wavelength division multiplexer 4, a single-mode semiconductor pump laser 5, an optical coupler 6, an optical isolator 7, an optical circulator 8, an optical filter module 9 and a semiconductor optical amplifier 10. A structure relationship between each component is that the high gain optical fiber 2 is used as a gain medium of a laser resonant cavity with a compact structure, and the low-reflectivity chirped optical fiber grating 3 and the high-reflectivity chirped optical fiber grating 1 form front and back cavity mirrors of the laser resonant cavity to realize laser oscillation in the cavity. The high-reflectivity chirped optical fiber grating 1, the high gain optical fiber 2 and the low-reflectivity chirped optical fiber grating 3 form the laser resonant cavity. A portion of the laser enters the optical filter module 9 via the optical circulator 8 after the laser outputted by the resonant cavity passes through the optical coupler 6. After selecting a plurality of wavelengths corresponding to central frequencies via the optical filter module 9 with a certain free spectrum width, the laser is injected back into the laser resonant cavity via the optical circulator 8 and the optical coupler 6, combined with a short linear resonant cavity structure, the resonant cavity after self-injection locking lases single-frequency optical fiber laser with a plurality of wavelengths corresponding to the central frequencies. A single-frequency laser signal enters the optical coupler 6 via a signal end of the optical wavelength division multiplexer 4, and then is outputted from an output end of the optical isolator 7. The outputted laser signal is subjected to noise suppression and optical performance optimization via the semiconductor optical amplifier 10.

Embodiment 1

A central reflection wavelength of the high-reflectivity chirped optical fiber grating 1 in this embodiment is a laser output wavelength (1552.52 nm), a 3 dB reflection spectrum width thereof is 40 nm, and a central wavelength reflectivity in this embodiment is greater than 99.95%. A central reflection wavelength of a coupling output grating of the low-reflectivity chirped optical fiber grating 3 is the laser output wavelength (1552.52 nm), a 3 dB bandwidth thereof is 40 nm, a central wavelength reflectivity thereof is 10% to 95%, and the central wavelength reflectivity in this embodiment is 60%. The high-reflectivity chirped optical fiber grating 1 and the low-reflectivity chirped optical fiber grating 3 form a functional module with wider spectral range selection and filtering functions. The high-reflectivity chirped optical fiber grating 1 and the high gain optical fiber 2 are connected by welding or end-face butt jointing. The high gain optical fiber 2 and the low-reflectivity chirped optical fiber grating 3 are connected by grinding and polishing an end surface of the optical fiber and tightly butting the cavity mirror. A beam splitting ratio of the optical coupler ranges from 1:99 to 50:50, and the optical coupler 6 with a beam g ratio of 10:90 is used in this embodiment. The optical filter module 9 used in this embodiment is an Fabry-Pérot (F-P) cavity etalon filter with a free spectral range of 8 nm and a 3 dB bandwidth of 0.02 nm, which outputs four corresponding wavelengths appearing in a chirped grating bandwidth.

Backward pumping is used as a pumping method in this embodiment, and pump light generated by the single-mode semiconductor pump laser 5 is inputted via a pumping end of the optical wavelength division multiplexer 4 into an optical fiber core of the high gain optical fiber 2 via the low-reflectivity chirped optical fiber grating 3 for optical fiber core pumping. The pump light continuously pumps the gain particles in the optical fiber core to reach the particle number for inverting and generating laser signals by stimulated emission. After optical signals continuously outputted by the resonant cavity pass through the optical coupler 6 of 10:90, 90% of the signal light enters the F-P etalon filter via the optical circulator 8, then multiple single longitudinal-modes in the low-reflectivity chirped grating bandwidth are selected by adjusting the etalon filter to obtain the multi-wavelength single-frequency laser signal, and then the laser signal is injected back into the resonant cavity via the optical circulator 8 and the optical coupler 6, and then the resonant cavity after self-injection locking generates single-frequency laser signals with wavelengths of 1536.51 nm, 1544.64 nm, 1552.52 nm and 1560.36 nm. The laser signals enter the optical coupler 6 via the signal end of the optical wavelength division multiplexer 4, 10% of the single-frequency laser signals are outputted from the output end of the optical isolator 7, and low-noise four-wavelength single-frequency laser output can be obtained via the semiconductor optical amplifier 10.

What is claimed is:
1. A multi-wavelength single-frequency optical fiber laser source for a laser radar system, comprising:
   a high-reflectivity chirped optical fiber grating;
   a high gain optical fiber;
   a low-reflectivity chirped optical fiber grating;
   an optical wavelength division multiplexer;
   a single-mode semiconductor pump laser;
   an optical coupler;
   an optical isolator;
   an optical circulator;
   an optical filter module; and
   a semiconductor optical amplifier,
   wherein the low-reflectivity chirped optical fiber grating and the high-reflectivity chirped optical fiber grating form front and back cavity mirrors of a laser resonant cavity to realize laser oscillation in the cavity, the high gain optical fiber is used as a gain medium of the laser resonant cavity, the high-reflectivity chirped optical fiber grating, the high gain optical fiber and the low-reflectivity chirped optical fiber grating form the laser resonant cavity, pump light generated by the single-mode semiconductor pump laser is inputted via a pumping end of the optical wavelength division multiplexer into an optical fiber core of the high gain optical fiber via the low-reflectivity chirped optical fiber grating for optical fiber core pumping, a portion of the laser enters the optical filter module via the optical circulator after the laser outputted by the laser resonant cavity passes through the optical coupler, after selecting a wavelength corresponding to a nominal central frequency via the optical filter module, the laser is injected back into the laser resonant cavity via the optical circulator and the optical coupler, combined with a short linear resonant cavity structure, the resonant cavity after self-injection locking lases single-frequency optical fiber laser with a plurality of wavelengths corresponding to the nominal central frequency; and a single-frequency optical fiber laser signal enters the optical coupler via a signal end of the optical wavelength division multiplexer, another portion of the laser outputted by the optical coupler is outputted from an output end of the optical isolator, and the outputted multi-wavelength laser is subjected to noise suppression via the semiconductor optical amplifier.

2. The multi-wavelength narrow-linewidth single-frequency optical fiber laser source for a laser radar system according to claim 1, wherein the optical filter module structurally comprises an optical filter or a combination of multiple optical filters.

3. The multi-wavelength narrow-linewidth single-frequency optical fiber laser source for a laser radar system according to claim 1, wherein a free spectral range of the optical filter module is 0.5 nm to 500 nm, and more than two wavelengths are comprised in an output wavelength.

4. The multi-wavelength narrow-linewidth single-frequency optical fiber laser source for a laser radar system according to claim 1, wherein the optical fiber laser source is a short linear cavity structure.

5. The multi-wavelength narrow-linewidth single-frequency optical fiber laser source for a laser radar system according to claim 1, wherein the low-reflectivity chirped optical fiber grating has a low reflection to an exciting light signal, with a reflectivity of 10% to 90%, and a 3 dB reflection spectrum width of 1 nm to 40 nm; while the high-reflectivity chirped optical fiber grating is highly transparent to the pump light, with a transmissivity greater than 90%, and is highly reflective to the exciting light signal, with the reflectivity greater than 95%, and the 3 dB reflection spectrum width of 1 nm to 40 nm.

6. The multi-wavelength narrow-linewidth single-frequency optical fiber laser source for a laser radar system according to claim 1, wherein a gain per unit length of the high gain optical fiber is greater than 0.2 dB/cm, and a length of the optical fiber is 0.5 cm to 100 cm.

7. The multi-wavelength narrow-linewidth single-frequency optical fiber laser source for a laser radar system according to claim 1, wherein the optical filter module is an Fabry-Pérot filter or an optical fiber grating filter.

* * * * *